US008379471B2

(12) United States Patent
Kwean

(10) Patent No.: US 8,379,471 B2
(45) Date of Patent: Feb. 19, 2013

(54) REFRESH OPERATION CONTROL CIRCUIT, SEMICONDUCTOR MEMORY DEVICE INCLUDING THE SAME, AND REFRESH OPERATION CONTROL METHOD

(75) Inventor: Ki-Chang Kwean, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 114 days.

(21) Appl. No.: 12/974,562

(22) Filed: Dec. 21, 2010

(65) Prior Publication Data

US 2012/0106277 A1 May 3, 2012

(30) Foreign Application Priority Data

Oct. 29, 2010 (KR) .................... 10-2010-0107186

(51) Int. Cl.
*G11C 7/00* (2006.01)
(52) U.S. Cl. ... 365/222; 365/193; 365/194; 365/230.01; 365/230.06; 365/233.1
(58) Field of Classification Search .................. 365/222, 365/193, 194, 230.01, 230.06, 233.1
See application file for complete search history.

(56) References Cited

U.S. PATENT DOCUMENTS

| 6,366,515 | B2 * | 4/2002 | Hidaka | 365/200 |
|---|---|---|---|---|
| 6,477,108 | B2 * | 11/2002 | Arimoto et al. | 365/233.12 |
| 6,721,223 | B2 * | 4/2004 | Matsumoto et al. | 365/222 |
| 7,613,060 | B2 * | 11/2009 | Smith | 365/222 |
| 7,782,693 | B2 * | 8/2010 | Kim et al. | 365/203 |
| 7,881,141 | B2 * | 2/2011 | Abe | 365/222 |
| 8,072,827 | B2 * | 12/2011 | Wakimoto | 365/200 |
| 2010/0110817 | A1 * | 5/2010 | Noda et al. | 365/222 |
| 2011/0007592 | A1 * | 1/2011 | Tashiro | 365/222 |
| 2011/0069573 | A1 * | 3/2011 | Sato | 365/222 |

FOREIGN PATENT DOCUMENTS

| KR | 1020030037589 | 5/2003 |
|---|---|---|
| KR | 1020050041621 | 5/2005 |
| KR | 1020060023306 | 3/2006 |
| KR | 1020080084642 | 9/2008 |

OTHER PUBLICATIONS

Notice of Allowance issued by the Korean Intellectual Property Office on Nov. 20, 2012.

* cited by examiner

*Primary Examiner* — Viet Q Nguyen
(74) *Attorney, Agent, or Firm* — IP & T Group LLP

(57) ABSTRACT

A semiconductor memory device includes a bank including a first cell region and a second cell region, an active signal generation unit configured to generate a first row active signal and a second row active signal having different activation periods from each other in response to a refresh command, and an address counting unit configured to count the refresh command and generate a row address, wherein a word line of the first cell region designated by the row address is activated when the first row active signal is activated, and a word line of the second cell region designated by the row address is activated when the second row active signal is activated.

18 Claims, 5 Drawing Sheets

REFRESH OPERATION CONTROL CIRCUIT, SEMICONDUCTOR MEMORY DEVICE INCLUDING THE SAME, AND REFRESH OPERATION CONTROL METHOD

CROSS-REFERENCE TO RELATED APPLICATIONS

The present application claims priority of Korean Patent Application No. 10-2010-0107186, filed on Oct. 29, 2010, which is incorporated herein by reference in its entirety.

BACKGROUND OF THE INVENTION

Exemplary embodiments of the present invention relate to a semiconductor memory device.

A dynamic random access memory (DRAM) includes a plurality of memory cell units each of which may be configured with one transistor and one capacitor, and data is stored in the capacitor. However, data stored in a capacitor formed on a semiconductor substrate may be lost due to a natural leakage through the semiconductor substrate. Thus, the DRAM performs a refresh operation which refreshes data stored in a memory cell. If the operation of refreshing data stored in the memory cell is not performed stably, data may be damaged or the characteristic of the DRAM with respect to the read operation may be degraded. In addition, the DRAM may malfunction. As the integration degree of the DRAM increases, the number of memory cells to be refreshed in a refresh operation increases and the entire memory cells may not be refreshed through one word line. Hence, a bank is divided into a plurality of cell regions, and a refresh operation is performed on the plurality of cell regions.

As high integration technology of a semiconductor memory device is developed, the number of memory cells and signal lines provided in a single semiconductor memory device is rapidly increasing. In order to integrate the increasing memory cells and signal lines within a limited space, the critical dimension of an internal circuit of the semiconductor memory device has been reduced and the size of a memory cell has been gradually reduced. For these reasons, memory cells of a semiconductor memory device are more likely to be defective. Therefore, a redundancy device for repairing defective memory cells is provided within a semiconductor memory device so that the semiconductor memory device can be manufactured with a high yield in spite of such defective memory cells. The redundancy device includes redundancy memory cells and fuses for programming repair addresses corresponding to defective memory cells.

A variety of tests are performed after a fabrication process of a semiconductor memory device is completed. In a case in which a memory cell determined as a defective memory cell can be repaired, the defect of the memory cell is repaired by replacing the defective memory cell with a redundancy memory cell. That is, a programming is performed within an internal circuit to replace the address of the defective memory cell with the address of the redundancy memory cell. Accordingly, when the address, i.e., the repair address, corresponding to the defective memory cell is inputted, the defective memory cell is replaced with the redundancy memory cell. Thus, the semiconductor memory apparatus performs a normal operation.

Hereinafter, a method of refreshing a bank which is divided into two cell regions will be described as an example, and concerns which may arise when a word line is replaced through a refresh operation will be described.

FIG. 1 is a block diagram illustrating a refresh operation and concerns regarding the refresh operation.

Referring to FIG. 1, a semiconductor memory device includes a bank 100 which is divided into a first cell region 110 and a second cell region 120. In the bank 100, the first cell region 110 and the second cell region 120 correspond to an upper bank and a lower bank, respectively. In FIG. 1, a first signal A is a row active signal which activates a word line of the upper bank 110, and a second signal B is a row active signal which activates a word line of the lower bank 120.

As illustrated in a first operation diagram 101, when a refresh command is inputted, word lines 111 and 121 corresponding to row addresses counted by an address counting unit (not shown) are simultaneously activated within the upper bank 110 and the lower bank 120. That is, when the refresh command is inputted once, one word line 111 of the upper bank 110 and one word line 121 of the lower bank 120 are simultaneously activated, and a plurality of memory cells coupled to the activated word lines 111 and 121 are refreshed. The first line 111 is a word line activated by the first signal A, and the second line 121 is a word line activated by the second signal B.

The upper bank 110 and the lower bank 120 include a plurality of redundancy word lines for replacing word lines having defects. However, in a case in which the bank is divided into the upper bank 110 and the lower bank 120 and the refresh operation is simultaneously performed on the upper bank 110 and the lower bank 120, the upper bank 110 cannot use the redundancy word lines of the lower bank 120, and the lower bank 120 cannot use the redundancy word lines of the upper bank 110. The reasons are described below.

It is assumed in a second operation diagram 102 that a defect occurs in one word line 111A of the upper bank 110 and thus the word line 111A is replaced with a redundancy word line 121A. An arrow 103 represents that the defect occurs in the word line 111A of the upper bank 110 and the word line 111A is replaced with the word line 121A of the lower bank 120.

If a row address corresponding to the defective word 111A of the upper bank 110 is inputted, the redundancy word line 121A of the lower bank 120 is activated by the first signal A while another word line 121B of the lower bank 120 corresponding to the row address is activated by the second signal B. That is, if the defective word line 111A of the upper bank 110 is replaced with the redundancy word line 121A of the lower bank 120, two word lines 121A and 121B may be simultaneously activated in the lower bank 120 during the refresh operation. Therefore, data stored in memory cells coupled to the activated word lines 121A and 121B are simultaneously loaded on the same bit line. In other words, two data are loaded on one bit line. Consequently, an error may occur when the two data are different from each other.

SUMMARY OF THE INVENTION

An exemplary embodiment of the present invention is directed to a semiconductor memory device which can prevent simultaneous activation of two or more word lines within the same cell region during a refresh operation.

In accordance with an exemplary embodiment of the present invention, a semiconductor memory device includes: a bank including a first cell region and a second cell region; an active signal generation unit configured to generate a first row active signal and a second row active signal having different activation periods from each other in response to a refresh command; and an address counting unit configured to count the refresh command and generate a row address, wherein a word line of the first cell region designated by the row address is activated when the first row active signal is activated, and a word line of the second cell region designated by the row address is activated when the second row active signal is activated.

The active signal generation unit may include: a pre-active signal generation unit configured to activate a pre-active signal twice in response to the refresh command; and an enable unit configured to transfer the pre-active signal, during a first activation period, as the first row active signal, and transfer the pre-active signal, during a second activation period, as the second row active signal when a refresh signal representing a refresh period is activated.

The semiconductor memory device may further include a precharge signal generation unit configured to activate a precharge signal after the pre-active signal is activated.

In accordance with another exemplary embodiment of the present invention, a refresh operation control circuit includes: an active signal generation unit configured to activate a pre-active signal in response to a refresh command and generate a first row active signal and a second row active signal having different activation periods from each other by using the pre-active signal; and a precharge signal generation unit configured to activate a precharge signal for controlling the activation of the pre-active signal after the pre-active signal is activated once.

The active signal generation unit may include: a pre-active signal generation unit configured to activate the pre-active signal twice in response to the refresh command and the precharge signal; and an enable unit configured to transfer the pre-active signal, during a first activation period, as the first row active signal, and transfer the pre-active signal, during a second activation period, as the second row active signal when a refresh signal representing a refresh period is activated.

In accordance with yet another embodiment of the present invention, a refresh operation control method of a semiconductor memory device including a bank having a first cell region and a second cell region includes: activating a first row active signal when a refresh command is inputted, activating a word line, which is designated by a row address among word lines of the first cell region, in response to the first row active signal to refresh memory cells of the word line; deactivating the first row active signal and activating a second row active signal after a predetermined time elapses from the deactivation of the first row active signal; and activating a word line, which is designated by the row address among word lines of the second cell region, in response to the second row active signal to refresh memory cells of the word line.

DESCRIPTION OF SPECIFIC EMBODIMENTS

Figure 1:
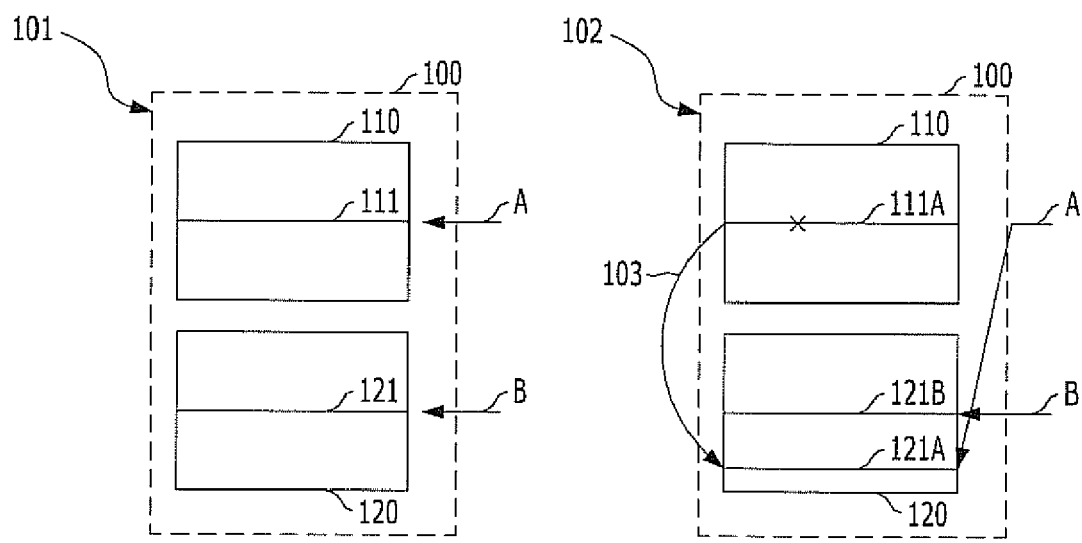
FIG. 1 is a block diagram illustrating a refresh operation and concerns arising during the refresh operation.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
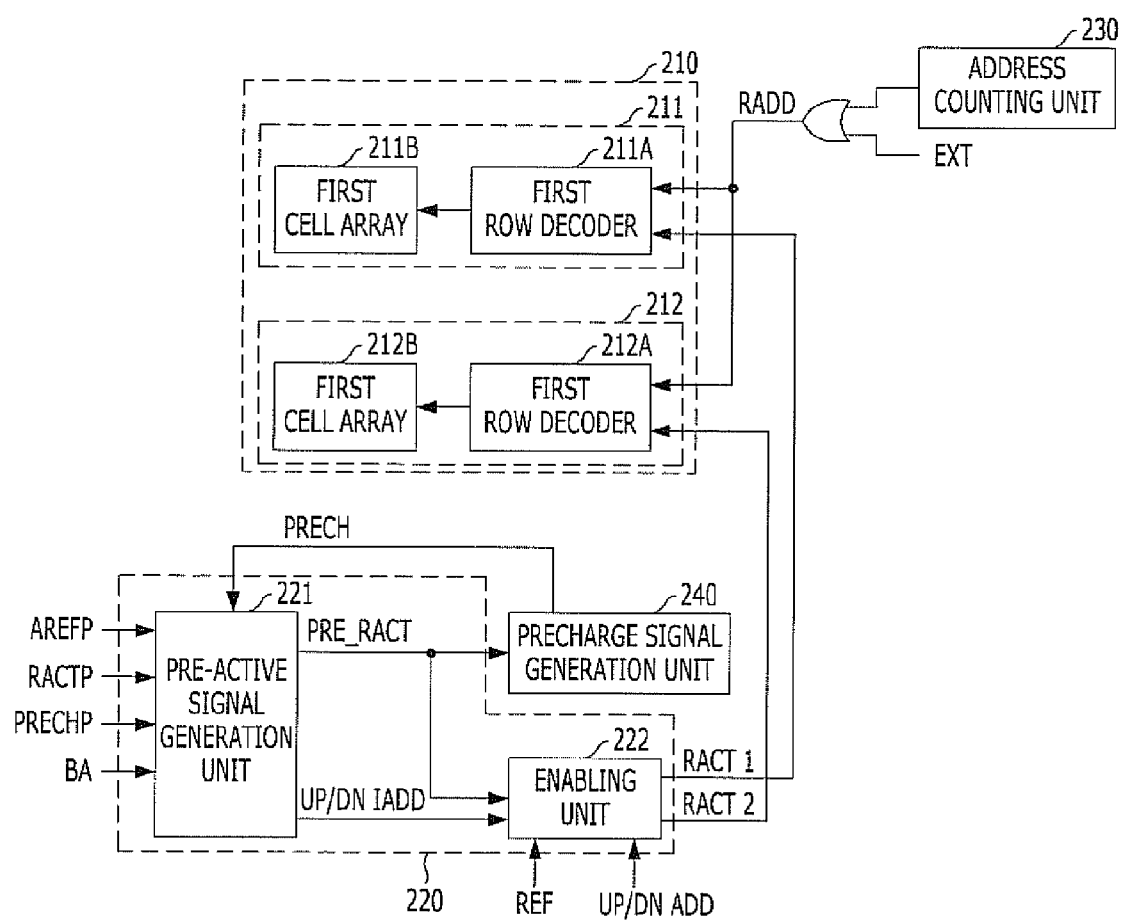
FIG. 2 is a diagram of a semiconductor memory device in accordance with an exemplary embodiment of the present invention.

FIG. 2 is a diagram of a semiconductor memory device in accordance with an exemplary embodiment of the present invention.

Referring to FIG. 2, the semiconductor memory device includes a bank 210, an active signal generation unit 220, an address counting unit 230, and a precharge signal generation unit 240. The bank 210 includes a first cell region 211 and a second cell region 212. The active signal generation unit 220 is configured to generate first and second row active signals RACT1 and RACT2 having different activation periods from each other in response to a refresh command AREFP. The address counting unit 230 is configured to count the refresh command AREFP and generate a row address RADD. The precharge signal generation unit 240 is configured to activate a precharge signal PRECH after a pre-active signal PRE_RACT is activated.

Here, that two signals have different activation periods means that the activation periods of the two signals do not overlap each other. For example, to say that first and second row active signals RACT1 and RACT2 have different activation periods means that the activation period of the first row active signal RACT1 does not overlap the activation period of the second row active signal RACT2.

In the first cell region 211, when the first row active signal RACT1 is activated, a word line designated by the row address RADD is activated. In the second cell region 212, when the second row active signal RACT2 is activated, a word line designated by the row address RADD is activated. The refresh command AREFP may be activated when an auto refresh command is inputted from the outside of the chip. The precharge signal generation unit 240 activates the precharge signal PRECH by delaying the pre-active signal PRE_RACT by a certain delay value.

The configuration and operation of the semiconductor memory device will be described below with reference to FIG. 2.

First, the configuration and operation of the bank 210 are described.

The bank 210 includes the first cell region 211 and the second cell region 212. The first cell region 211 includes a first row decoder 211A and a first cell array 211B. The first row decoder 211A is configured to designate a word line activated by the first row active signal RACT1 in response to the row address RADD. The first cell array 211B includes a plurality of word lines. The second cell region 212 includes a second row decoder 212A and a second cell array 212B. The second row decoder 212A is configured to designate a word line activated by the second row active signal RACT2 in response to the row address RADD. The second cell array 212B includes a plurality of word lines. The first cell array 211A and the second cell array 212A may be configured with one or more sub cell arrays. The first row decoder 211A and the second row decoder 212A may be configured with one or more sub decoders. The first cell region 211 and the second cell region 212 correspond to the upper bank and the lower bank, respectively.

Next, the configuration and operation of the active signal generation unit 220 are described.

The active signal generation unit 220 includes a pre-active signal generation unit 221 and an enable unit 222. The pre-active signal generation unit 221 is configured to activate a pre-active signal PRE_RACT twice in response to the refresh command AREFP. The enable unit 222 is configured to transfer the pre-active signal PRE_RACT, which is activated first, as the first row active signal RACT1, and the pre-active signal PRE_RACT, which is activated second, as the second row active signal RACT2 when a refresh signal REF representing a refresh period is activated.

In an active period, the pre-active signal generation unit 221 activates the pre-active signal PRE_RACT in response to an active command RACTP. When the refresh signal REF is deactivated, the enable unit 222 transfers the pre-active signal PRE_RACT as either the first row active signal RACT1 or the second row active signal RACT2, depending on an up/down address UP/DN ADD.

A procedure in which the pre-active signal PRE_RACT is activated in response to the input of the refresh command AREFP or the active command RACTP, and in which the activated pre-active signal PRE_RACT is transferred as the first row active signal RACT1 or the second row active signal RACT2 will be described below with reference to FIG. 3.

Next, the operation of the address counting unit 230 is described.

The address counting unit 230 is configured to sequentially increase the value of the row address RADD whenever the refresh command AREFP is activated. Alternatively, the address counting unit 230 may be configured to sequentially decrease the value of the row address RADD whenever the refresh command AREFP is activated. Therefore, whenever the refresh command AREFP is applied, the word lines of the first cell region 211 and the second cell region 212 are sequentially activated, and a plurality of memory cells coupled to the activated word lines are refreshed.

Finally, the operation of the precharge signal generation unit 240 is described.

When the pre-active signal PRE_RACT is activated, the precharge signal generation unit 240 activates the precharge signal PRECH after the elapse of a predetermined time. When the precharge signal PRECH is activated, the pre-active signal generation unit 221 deactivates the pre-active signal PRE_RACT activated first, and activates it again. When the pre-active signal PRE_RACT is activated at a second time, the precharge signal generation unit 240 activates the precharge signal PRECH again after the elapse of a predetermined time. When the precharge signal PRECH is activated, the pre-active signal generation unit 221 deactivates the pre-active signal PRE_RACT activated second.

Hereinafter, the refresh operation of the semiconductor memory device in accordance with an exemplary embodiment of the present invention will be described with reference to FIG. 2.

When the refresh command AREFP is applied, the first row active signal RACT1 and the second row active signal RACT2 are sequentially activated. A word line of the first cell region 211 (a word line designated by the row address RADD) is activated in response to the first row active signal RACT1, and a plurality of memory cells coupled to the activated word line are refreshed. In addition, a word line of the second cell region 212 (a word line designated by the row address RADD) is activated in response to the second row active signal RACT2, and a plurality of memory cells coupled to the activated word line are refreshed. At this time, since the first row active signal RACT1 and the second row active signal RACT2 have different activation periods from each other, the conventional malfunctions do not occur. That is, even when the defective word line of the first cell region 211 is replaced with the redundancy word line of the second cell region 212, two word lines are not simultaneously activated in the second cell region 212 because the first row active signal RACT1 and the second row active signal RACT2 have different activation periods from each other.

In the semiconductor memory device in accordance with an exemplary embodiment of the present invention, the word lines of the first cell region 211 and the second cell region 212 are activated in different periods even though the memory cells coupled to the two word lines are refreshed when the refresh command AREFP is inputted once. Thus, the semiconductor memory device in accordance with an exemplary embodiment of the present invention can address the conventional concerns and rapidly perform the refresh operation. That is, in the repair operation, the defective word line of the first cell region 211 can be replaced with the redundancy word line of the second cell region 212 (and vice versa), thereby increasing the flexibility of the repair operation and the refresh operation speed.

Hereinafter, the active operation of the semiconductor memory device in accordance with an exemplary embodiment of the present invention will be described with reference to FIG. 2.

In the general active operation (for example, a read operation or a write operation) other than the refresh operation, the active command RACTP instead of the refresh command AREFP is inputted. When a bank select signal BA is activated, the active signal generation unit 220 activates one of the first row active signal RACT1 and the second row active signal RACT2 depending on the up/down address UP/DN ADD, in response to the active command RACTP. In this case, the row address RADD is inputted from the outside through an external address input terminal EXT. That is, an address including information on a word line to be activated is inputted through the terminal EXT. The bank select signal BA is a signal generated by decoding a bank address.

Figure 3:
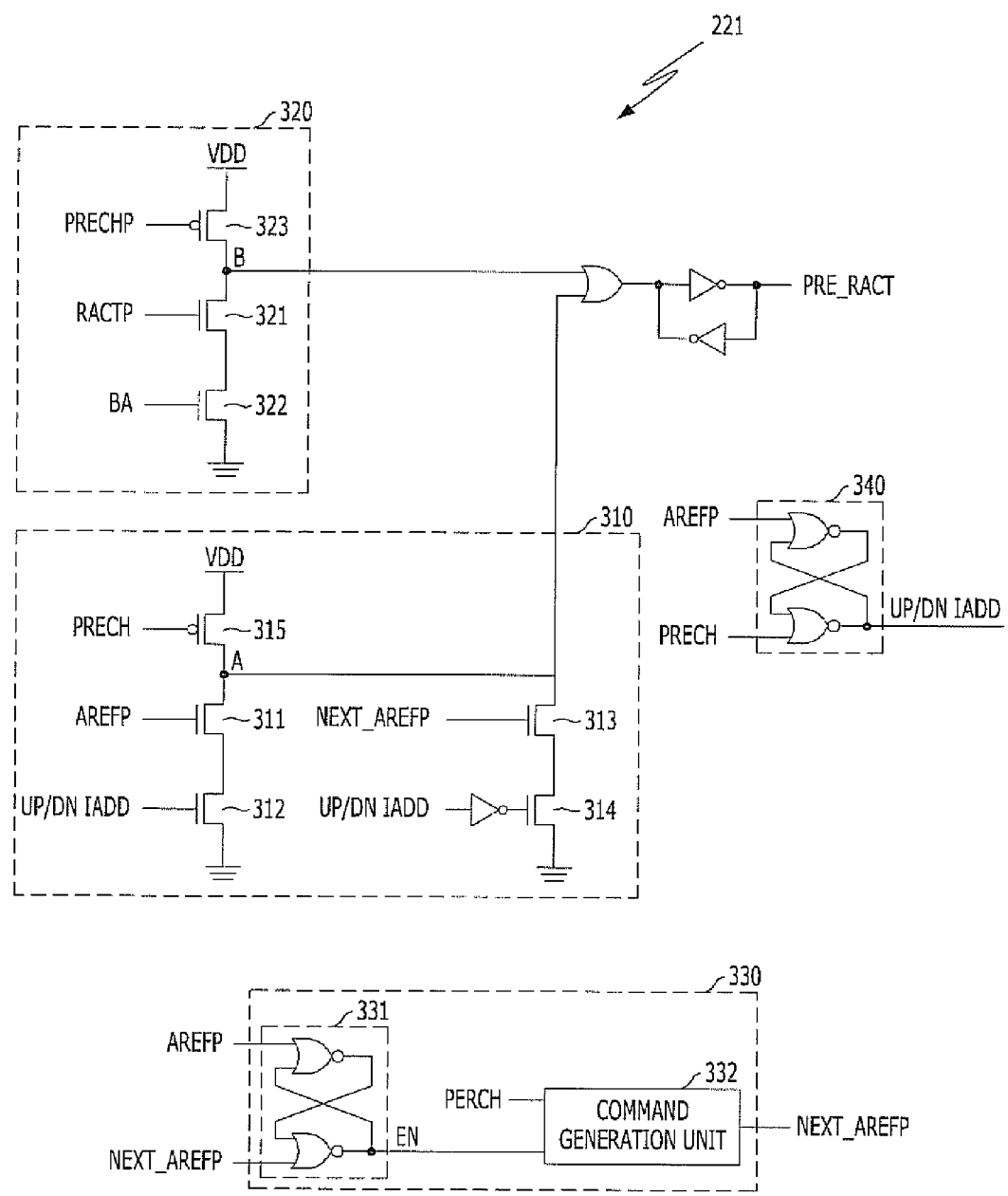
FIG. 3 is a diagram of a pre-active signal generation unit in accordance with an exemplary embodiment of the present invention.

FIG. 3 is a diagram of a pre-active signal generation unit 221 in accordance with an exemplary embodiment of the present invention. The bank select signal BA determines whether to perform the active operation on the memory cells included in the bank 210.

Referring to FIG. 3, the pre-active signal generation unit includes a first pre-active signal generation circuit 310, a second pre-active signal generation circuit 320, a next command generation circuit 330, and an internal address generation circuit 340. The first pre-active signal generation circuit 310 activates the pre-active signal PRE_RACT when the refresh command AREFP and a next refresh command NEXT_AREFP are inputted. In a case in which the bank select signal BA is activated, the second pre-active signal generation circuit 320 activates the pre-active signal PRE_RACT when the active command RACTP is inputted. The next command generation circuit 330 activates the next refresh command NEXT_AREFP by delaying the precharge signal PRECH by a predetermined time. The internal address generation circuit 340 generates an internal up/down address UP/DN IADD in response to the refresh command AREFP or the precharge signal PRECH.

First, the procedure of activating the pre-active signal PRE_RACT in the refresh period is described.

When the refresh command AREFP is inputted, a first NMOS transistor 311 of the first pre-active signal generation circuit 310 is turned on. When the refresh command AREFP is inputted, the internal address generation circuit 340 outputs an internal up/down address UP/DN IADD having a high logic level. The internal up/down address UP/DN IADD, having a high logic level, turns on a second NMOS transistor 312 to pull-down drive an internal node A. The voltage of the internal node A is inverted and the pre-active signal PRE_RACT is activated to a high logic level. The precharge signal generation unit 240 activates the precharge signal PRECH after the elapse of a predetermined time from the activation of the pre-active signal PRE_RACT.

When the precharge signal PRECH is activated, a first PMOS transistor 315 of the first pre-active signal generation circuit 310 is turned on to pull-up drive the internal node A. The voltage of the internal node A is inverted and the pre-active signal PRE_RACT is deactivated to a low logic level.

The next command generation circuit 330 includes an enable signal generation unit 331 and a command generation unit 332.

When the refresh command AREFP is inputted, the enable signal generation unit 331 activates the enable signal EN. When the enable signal EN is activated, the command generation unit 332 activates the next refresh command NEXT_AREFP by delaying the precharge signal PRECH by a predetermined time. At this time, the sum of the activation period of the precharge signal PRECH and the delay value of the command generation unit 332 is longer than the time taken to precharge the word line activated by the first row active signal RACT1. The command generation unit 332 corresponds to a general delay circuit whose activation is determined by the enable signal EN.

When the next refresh command NEXT_AREFP is inputted, a third NMOS transistor 313 of the first pre-active signal generation circuit 310 is turned on. When the precharge signal PRECH is activated, the internal address generation circuit 340 outputs an internal up/down address UP/DN IADD having a logic low level. The internal up/down address UP/DN IADD, having a logic low level, turns on a fourth NMOS transistor 314 to pull-down drive the internal node A. The voltage of the internal node A is inverted and the pre-active signal PRE_RACT is activated to a high logic level. The precharge signal generation unit 240 activates the precharge signal PRECH after the elapse of a predetermined time from the activation of the pre-active signal PRE_RACT.

When the next refresh command NEXT_AREFP is activated, the enable signal generation unit 331 deactivates the enable signal EN. Therefore, even though the precharge signal PRECH is again activated, the next refresh command NEXT_AREFP is not activated. That is, the pre-active signal PRE_RACT may be activated only two times when the refresh command AREFP is inputted once.

In addition, the internal address generation circuit 340 changes the internal up/down address UP/DN IADD to a low logic level when the precharge signal PRECH is activated first, and then maintains the internal up/down address UP/DN IADD at a low logic level when the precharge signal PRECH is again activated.

In the active operation, the pre-active signal generation unit 221 operates as follows. In the active period, the pre-active signal PRE_RACT is generated by the second pre-active signal generation circuit 320. When the bank 210 is selected by the bank select signal BA, a sixth NMOS transistor 322 is turned on. When the active command RACTP is inputted, a fifth NMOS transistor 321 is turned on and an internal node B is pull-down driven. The voltage of the internal node B is inverted and the pre-active signal PRE_RACT is activated.

In the active period, the pre-active signal PRE_RACT is deactivated by a precharge command PRECHP. When the precharge command PRECHP is inputted, a second PMOS transistor 323 is turned on to pull-up drive the internal node B. The voltage of the internal node B is inverted and the pre-active signal PRE_RACT is deactivated.

Figure 4:
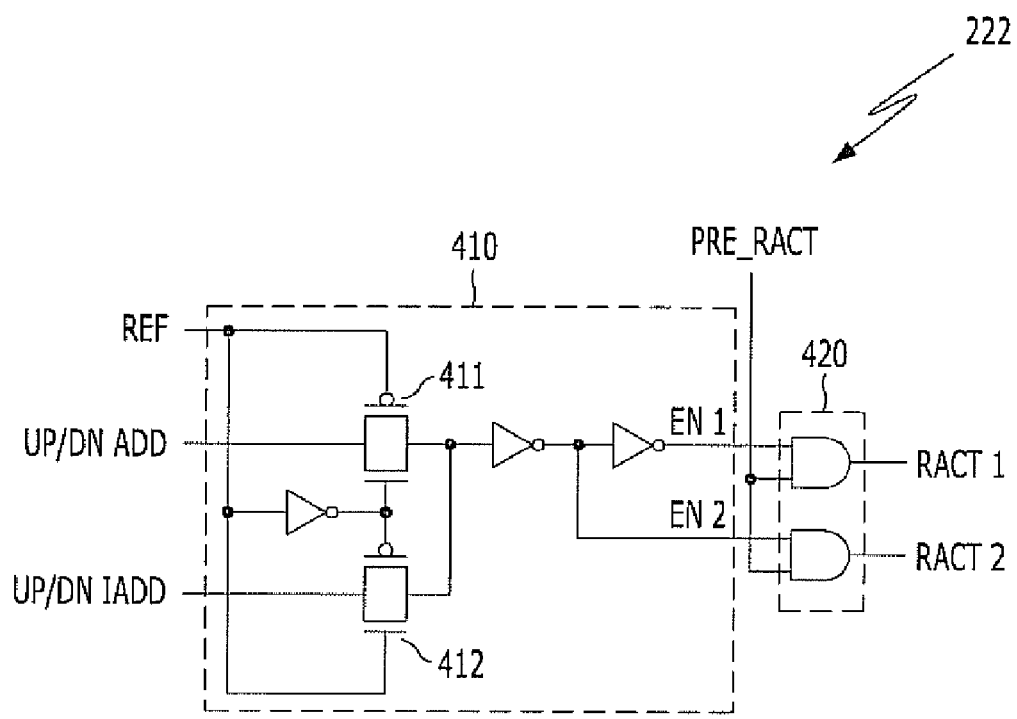
FIG. 4 is a diagram of an enable unit in accordance with an exemplary embodiment of the present invention.

FIG. 4 is a diagram of the enable unit 222 in accordance with an exemplary embodiment of the present invention.

Referring to FIG. 4, the enable unit 222 includes an up/down enable signal generation circuit 410 and an enable circuit 420. When the refresh signal REF is activated (i.e., during the refresh period), the up/down enable signal generation circuit 410 generates a first enable signal EN1 and a second enable signal EN2 in response to the internal up/down address UP/DN IADD. In addition, when the refresh signal REF is deactivated (i.e., during the active period), the up/down enable signal generation circuit 410 generates the first enable signal EN1 and the second enable signal EN2 in response to the up/down address UP/DN ADD.

The up/down enable signal generation circuit 410 of FIG. 4 activates the first enable signal EN1 when the up/down address UP/DN ADD or the internal up/down address UP/DN IADD is at a high logic level, and activates the second enable signal EN2 when the up/down address UP/DN ADD or the internal up/down address UP/DN IADD is at a low logic level.

The generation of the first enable signal EN1 and the second enable signal EN2 by using the up/down address UP/DN ADD is achieved through a first pass gate 411, and the generation of the first enable signal EN1 and the second enable signal EN2 by using the internal up/down address UP/DN IADD is achieved through a second pass gate 412.

The enable circuit 420 transfers the pre-active signal PRE_RACT as the first row active signal RACT1 or the second row active signal RACT2 in response to the first enable signal EN1 and the second enable signal EN2. When the first enable signal EN1 is activated, the pre-active signal PRE_RACT is transferred as the first row active signal RACT1. When the second enable signal EN2 is activated, the pre-active signal PRE_RACT is transferred as the second row active signal RACT2.

The refresh operation control device in accordance with an exemplary embodiment of the present invention may include an active signal generation unit 220 and a precharge signal generation unit 240. The active signal generation unit 220 generates the first row active signal RACT1 and the second row active signal RACT2 having different activation periods from each other in response to the refresh command AREFP. The precharge signal generation unit 240 activates the precharge signal PRECH after the pre-active signal PRE_RACT is activated. The detailed configuration and operation of the refresh operation control device are identical to those described above with reference to FIGS. 2, 3, and 4.

Figure 5:
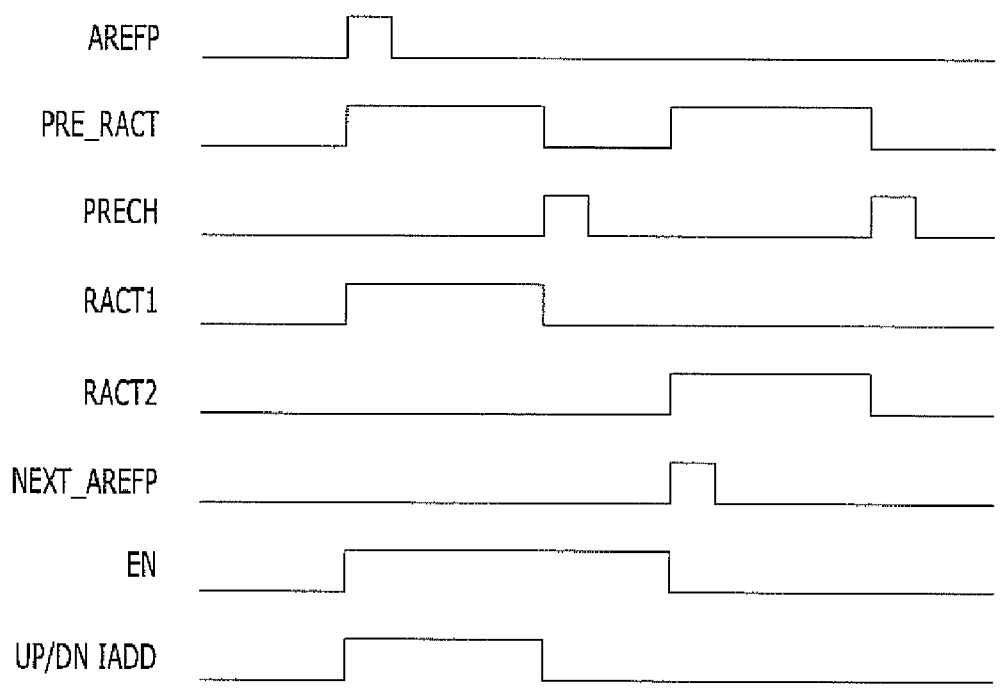
FIG. 5 is a waveform diagram illustrating a refresh operation of the semiconductor memory device in accordance with an exemplary embodiment of the present invention.

FIG. 5 is a waveform diagram illustrating the refresh operation of the semiconductor memory device in accordance with an exemplary embodiment of the present invention.

When the refresh command AREFP is inputted, the enable signal generation unit 331 of the next command generation circuit 330 activates the enable signal EN. The internal address generation unit 340 changes the internal up/down address UP/DN IADD to a high logic level. In addition, the pre-active signal PRE_RACT is activated first by the first pre-active signal generation circuit 310. Since the internal up/down address UP/DN IADD is at a high logic level, the activated pre-active signal PRE_RACT is transferred as the first row active signal RACT1.

The precharge signal generation circuit 240 activates the precharge signal PRECH in response to the activated pre-active signal PRE_RACT. When the precharge signal PRECH is activated, the pre-active signal PRE_RACT is deactivated by the first pre-active signal generation circuit 310. In addition, the internal address generation unit 340 changes the internal up/down address UP/DN IADD to a low logic level in response to the precharge signal PRECH. The command generation unit 332 activates the next refresh command NEXT_AREFP by delaying the precharge signal PRECH by a predetermined time.

When the next refresh command NEXT_AREFP is activated, the enable signal generation unit 331 of the next command generation circuit 330 deactivates the enable signal EN. In addition, the pre-active signal PRE_RACT is activated second by the first pre-active signal generation circuit 310. Since the internal up/down address UP/DN IADD is at a low logic level, the activated pre-active signal PRE_RACT is transferred as the second row active signal RACT2.

The precharge signal generation circuit 240 activates the precharge signal PRECH in response to the activated pre-active signal PRE_RACT. When the precharge signal PRECH is activated, the pre-active signal PRE_RACT is deactivated by the first pre-active signal generation circuit 310. The internal up/down address UP/DN IADD is maintained at a low logic level. However, the command generation unit 332 does not activate the next refresh command NEXT_AREFP again because the enable signal generation unit 331 of the next command generation circuit 330 deactivates the enable signal EN.

Through the above operations, the first row active signal RACT1 and the second row active signal RACT2 are sequentially activated when the refresh command AREFP is inputted.

Hereinafter, a refresh operation control method in accordance with an exemplary embodiment of the present invention will be described with reference to FIGS. 2 to 5.

In the refresh operation control method of the semiconductor memory device including the bank 210 having the first cell region 211 and the second cell region 212, when the refresh command AREFP is inputted, the first row active signal RACT1 is activated, and the word line designated by the row address RADD among the word lines of the first cell region 211 is activated and refreshed. Then, the first row active signal RACT is deactivated. After a predetermined time elapses from the deactivation of the first row active signal RACT, the next refresh command NEXT_AREFP is generated. When the next refresh command NEXT_AREFP is inputted, the second row active signal RACT2 is activated, and the word line designated by the row address RADD among the word lines of the second cell region 212 is activated and refreshed.

When the refresh command is inputted, the pre-active signal PRE_RACT is activated twice. The first activation of the pre-active signal PRE_RACT is transferred as the first row active signal RACT1, and the second activation of the pre-active signal PRE_RACT is transferred as the second row active signal RACT2.

The pre-active signal is deactivated in response to the precharge signal PRECH which is activated by delaying the pre-active signal PRE_RACT by a predetermined delay value. The row address RADD is a count value counted whenever the refresh command AREFP is inputted.

The semiconductor memory device in accordance with exemplary embodiments of the present invention prevents two word lines from being simultaneously activated in one cell region by separating the activation time points of the word lines in the refresh operation.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device comprising:
a bank including a first cell region and a second cell region;
an active signal generation unit configured to generate a first row active signal and a second row active signal having different activation periods from each other in response to a refresh command; and
an address counting unit configured to count the refresh command and generate a row address,
wherein a word line of the first cell region designated by the row address is activated when the first row active signal is activated, and a word line of the second cell region designated by the row address is activated when the second row active signal is activated,
wherein the active signal generation unit comprises:
a pre-active signal generation unit configured to activate a pre-active signal in response to the refresh command and a precharge signal; and
an enable unit configured to transfer the pre-active signal, during a first activation period, as the first row active signal, and transfer the pre-active signal, during a second activation period, as the second row active signal when a refresh signal representing a refresh period is activated.

2. The semiconductor memory device of claim 1, wherein the address counting unit sequentially increases a value of the row address whenever the refresh command is activated, or sequentially decreases the value of the row address whenever the refresh command is activated.

3. The semiconductor memory device of claim 1, wherein, when a bank select signal is activated, the active signal generation unit activates one of the first row active signal and the second row active signal depending on an up/down address.

4. The semiconductor memory device of claim 1 wherein the pre-active signal generation unit activates the pre-active signal in response to an active command, and the enable unit transfers the pre-active signal as one of the first row active signal and the second active signal depending on an up/down address, when the refresh signal is deactivated.

5. The semiconductor memory device of claim 3, wherein, when the active command is activated, an address is inputted as the row address from the outside of the semiconductor memory device.

6. The semiconductor memory device of claim 1 further comprising a precharge signal generation unit configured to activate the precharge signal after the pre-active signal is activated.

7. The semiconductor memory device of claim 6, wherein the precharge signal generation unit is configured to activate the precharge signal by delaying the pre-active signal by a predetermined delay value.

8. The semiconductor memory device of claim 6, wherein the preactive signal generation unit is configured to deactivate the pre-active signal when the precharge signal is activated.

9. The semiconductor memory device of claim 1, wherein the first cell region comprises:
a first cell array comprising a plurality of word lines; and
a first row decoder configured to designate one of the plurality of word lines which is activated by the first row active signal in response to the row address, and
the second cell region comprises:
a second cell array comprising a plurality of word lines; and
a second row decoder configured to designate one of the plurality of word lines which is activated by the second row active signal in response to the row address.

10. The semiconductor memory device of claim 1, wherein the refresh command is activated when an auto refresh command is activated.

11. A refresh operation control circuit comprising:
- an active signal generation unit configured to activate a pre-active signal in response to a refresh command and generate a first row active signal and a second row active signal having different activation periods from each other by using the pre-active signal; and
- a precharge signal generation unit configured to activate a precharge signal for controlling the activation of the pre-active signal after the pre-active signal is activated once,
- wherein the active signal generation unit comprises:
  - a pre-active signal generation unit configured to activate the pre-active signal in response to the refresh command and the precharge signal; and
  - an enable unit configured to transfer the pre-active signal. during a first activation period, as the first row active signal and transfer the pre-active signal, during a second activation period. as the second row active signal when a refresh signal representing a refresh period is activated.

12. The refresh operation control circuit of claim 11, wherein the precharge signal generation unit is configured to activate the precharge signal by delaying the pre-active signal by a predetermined delay value.

13. The refresh operation control circuit of claim 11, wherein the pre-active signal generation unit deactivates the pre-active signal when the precharge signal is activated.

14. A refresh operation control method of a semiconductor memory device including a bank having a first cell region and a second cell region, the refresh operation control method comprising:
- activating a first row active signal when a refresh command is inputted,
- activating a word line, which is designated by a row address among word lines of the first cell region, in response to the first row active signal to refresh memory cells of the word line;
- deactivating the first row active signal and activating a second row active signal after a predetermined time elapses from the deactivation of the first row active signal; and
- activating a word line, which is designated by the row address among word lines of the second cell region, in response to the second row active signal to refresh memory cells of the word line,
- wherein the activating of the second row active signal comprises:
  - generating a next refresh command according to the deactivation of the first row active signal. and
  - activating the second row active signal in response to the next refresh command.

15. The refresh operation control method of claim 14, wherein the activating of the first and second row active signals comprises activating a pre-active signal, the pre-active signal being activated twice after the refresh command is inputted.

16. The refresh operation control method of claim 15, wherein the pre-active signal is deactivated in response to a precharge signal which is activated by delaying the pre-active signal by a predetermined delay value.

17. The refresh operation command method of claim 14, wherein the row address is a value which is counted whenever the refresh command is inputted.

18. The semiconductor memory device of claim 1, wherein the pre-active signal generation unit comprises:
- a first pre-active signal generation circuit configured to activate the pre-active signal when the refresh command and a next refresh command are input;
- a second pre-active signal generation circuit configured to activate the pre-activate signal when the active command is input in a case in which a bank select signal is activated;
- a next command generation circuit configured to activate the next refresh command by delaying the precharge signal by a predetermined time; and
- an internal address generation circuit configured to generate an internal up/down address in response to the refresh command or the precharge signal.

* * * * *